(12) United States Patent
Naffziger et al.

(10) Patent No.: US 7,157,895 B2
(45) Date of Patent: Jan. 2, 2007

(54) SYSTEMS AND METHODS FOR GENERATING A CURRENT

(75) Inventors: Samuel D. Naffziger, Fort Collins, CO (US); William P. Repasky, Fort Collins, CO (US); Christopher Jonathan Bostak, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 343 days.

(21) Appl. No.: 10/700,919

(22) Filed: Nov. 4, 2003

(65) Prior Publication Data

US 2005/0093619 A1    May 5, 2005

(51) Int. Cl.
*G05F 3/16* (2006.01)
(52) U.S. Cl. ...................... 323/315; 327/403
(58) Field of Classification Search ............. 341/135, 341/136, 169; 326/82, 83; 327/403, 404, 327/427; 323/315; 330/295
See application file for complete search history.

(56) References Cited

U.S. PATENT DOCUMENTS

| | | | |
|---|---|---|---|
| 4,231,020 A * | 10/1980 | Azzis et al. ............... | 341/135 |
| 4,573,005 A | 2/1986 | van de Plassche | |
| 4,980,639 A | 12/1990 | Yoshizawa et al. | |
| 5,017,919 A * | 5/1991 | Hull et al. .................. | 341/136 |
| 5,557,620 A | 9/1996 | Miller, Jr. et al. | |
| 6,160,441 A | 12/2000 | Stratakos et al. | |
| 6,400,227 B1 * | 6/2002 | Goldfarb et al. ............ | 330/295 |
| 6,469,533 B1 | 10/2002 | Kurd et al. | |
| 2005/0024252 A1 * | 2/2005 | Ezell .......................... | 341/169 |

FOREIGN PATENT DOCUMENTS

JP       03048506 A       3/1991

OTHER PUBLICATIONS

United Kingdom Search Report for GB0424186.5 dated Feb. 16, 2005. Search conducted for claims 1-10 completed Feb. 15, 2005.

* cited by examiner

*Primary Examiner*—Jessica Han (57) ABSTRACT

Systems and methods are provided for generating a current. A first current source generates a first current based on a first current selection signal, and a second current source generates a second current that is a multiple of the first current in response to selection of the first current.

30 Claims, 5 Drawing Sheets

SYSTEMS AND METHODS FOR GENERATING A CURRENT

BACKGROUND

Power consumption is becoming an increasing concern in the design of integrated circuits (ICs), particularly for very large scale integration (VLSI) chip design. Increases in power consumption are outpacing the advantages of advances in scaling in silicon technologies, and the benefits of reducing power supply voltages. Power management has been recognized as an important consideration associated with the design and operation of VLSI (Very Large Scale Integration) chips to mitigate power consumption associated with VLSI chips. Consequently, approaches exist to adjust the supply voltage in response to changes in current drawn by the VLSI device.

For a variety of applications including the calibration of a power management system, it is desirable to generate a precise current with amperage in the same order of magnitude as that consumed by the VLSI device itself. Fabrication of precise current sources on VLSI devices is very difficult due to process variations associated with the fabrications of current sources, including those employing CMOS and Bipolar-CMOS technologies. In general, process variations can include lot-to-lot variations, wafer-to-wafer variations, die-to-die variations and within-die variations.

SUMMARY

The present invention relates generally to systems and methods for generating a current. One embodiment of the present invention provides a system with a first current source having a first configuration that is selectively adjusted to achieve a first current. The system also includes a second current source having a second configuration that is selected to generate a second current that is a multiple of the first current in response to a selection of the first configuration.

Another embodiment relates to an integrated circuit. The integrated circuit comprises a first set of semiconductor devices configured to provide a variable current source that generates a first current based on a first selection signal. A seconds set of semiconductor devices are configured to provide a variable current source that generates a second current based on a second binary selection signal. The first set of semiconductor devices having an associated matching semiconductor device from the second set of semiconductor devices that has a width that is a multiple of the width of the associated semiconductor device of the first set of semiconductor devices. The integrated circuit further includes a control device that determines the value of the first current and sets the second selection signal to provide the second current that is a multiple of the first current.

DETAILED DESCRIPTION

Systems and methods are provided for generating a current (e.g., on an integrated circuit). The systems and methods employ a first current source that is configured to generate a first current. A current selector determines the value of the first current based on a voltage drop across a precision resistor coupled between a fixed reference voltage and the first current source. The current selector selectively adjusts the configuration of the first current source until a desired first current is achieved. Once the desired first current is achieved, a second current source is configured to provide a second current that is a multiple of the first current. The second current source is coupled to a supply voltage of an integrated circuit in which the first and second current sources reside. Adjustments are provided to compensate for the differences in the fixed reference voltage and the supply voltage. In this manner, fluctuations associated with the supply voltage do not affect the selection of the first current and the second current.

Figure 1:
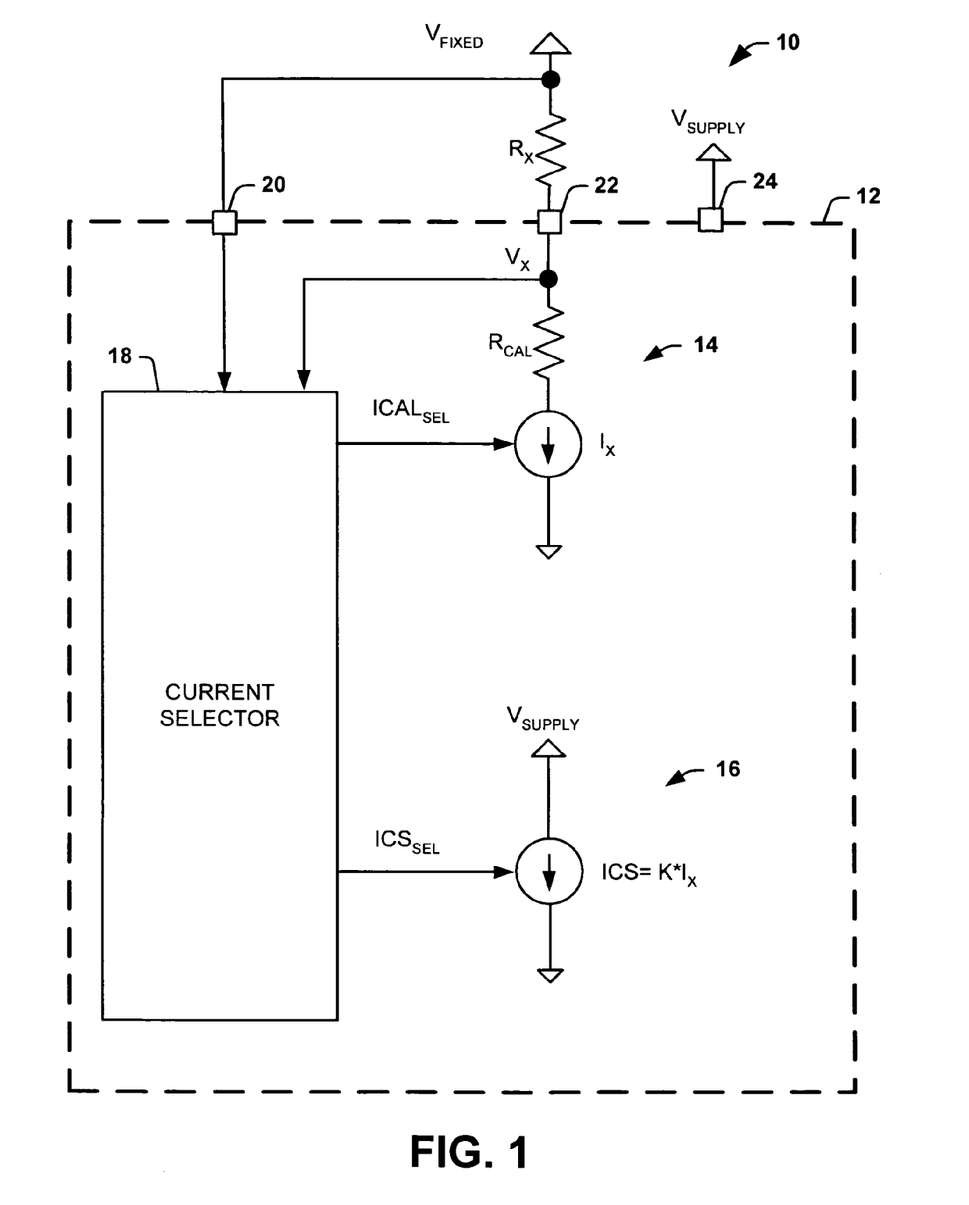
FIG. 1 illustrates an embodiment of a system for generating a current.

FIG. 1 illustrates a system 10 for generating a current. The system 10 provides for selectively adjusting a configuration of a first variable current source 14 via a first selection signal $ICAL_{SEL}$ to achieve a desired first current $I_X$ based on a voltage drop across a precision resistor $R_X$. The first variable current source 14 includes the current $I_X$ and its associated resistance $R_{CAL}$. A second variable current source 16 is configured to provide a second current ICS that is a multiple K (e.g., K=40) of the first current $I_X$ via a second selection signal $ICS_{SEL}$ in response to a selection of the configuration of the first variable current source 14. The multiple K can be an integer or fractional multiplier greater than one. The first variable current source 14 is employed to calibrate the second variable current source 16. The first variable current source 14 and the second variable current source 16 can be formed from semiconductor devices. The semiconductor devices can be matched to provide the desired multiple K.

The system 10 is implemented on an integrated circuit (IC) or die 12 such as a VLSI chip (e.g., a microprocessor, an application specific integrated circuit (ASIC)) or the like. The system 10 provides for the implementation of a large accurate current on the IC 12 in spite of process variations associated with fabrication of the IC 12. The process variations can include lot-to-lot variations, wafer-to-wafer variations, die-to-die variations as well as within-die variations. The second variable current source 16 can provide the second current ICS that is of the same order of magnitude as the current drawn by the IC 12. It is to be appreciated that the system 10 can be implemented with discrete components in a non-integrated circuit.

The IC 12 includes a first terminal 20 operative to receive a fixed reference voltage $V_{FIXED}$. A second terminal 22 is operative to be coupled to a first end of a precision resistor $R_X$ off the IC 12. A second end of the precision resistor $R_X$ is coupled to the fixed reference voltage $V_{FIXED}$, such that the voltage drop across the precision resistor $R_X$ is provided at the first and second terminals 20 and 22. The IC 12 includes a third terminal 24 coupled to a supply voltage of the IC 12. It is to be appreciated that the IC 12 can be formed of a plurality of portions to form a VLSI circuit, such as a microprocessor. For example, a microprocessor circuit can be formed of several portions such as one or more cores, cache memory and input/output portion, such that the supply voltage can be operative to provide voltage to one of the portions of the microprocessor with different supply voltages and different systems 10 residing on one or more of the portions.

A current selector 18 controls the state of the first selection signal $ICAL_{SEL}$ that controls the current selection of the first variable current source 14, and the second selection signal $ICS_{SEL}$ that controls the current selection of the second variable current source 16. The current selector 18 selects a current $I_X$ for the first variable current source 14 associated with a desired source current of the second variable current source 16. The current selector 18 then measures the voltage drop across the precision resistor $R_X$, and selectively adjusts the current $I_X$, until a voltage $V_X$ at the second end of the precision resistor $R_X$ achieves a desired voltage corresponding to a desired first current $I_X$. That is, $I_X$ is substantially equal to $V_{FIXED} - V_X/R_X$. The desired voltage corresponds to a desired source current associated with the second variable current source 16. The second variable current source 16 provides the second current ICS that is a multiple of the first current $I_X$, such that $ICS = K*I_X$ for similar selections of the first and second selection signals, where K is an integer or fractional multiplier greater than one. The second variable current source is coupled to the supply voltage $V_{SUPPLY}$ of the IC 12.

For example, if it is desired to provide a current of 1 Amp from the second variable current source 16 and K is equal to 40, then $V_X$ is adjusted until $I_X$ is substantially equal to 25 mA. Once the desired voltage $V_X$ is achieved to provide the desired current $I_X$, then the second selection signal $ICS_{SEL}$ is set to provides a current ICS from the second variable current source 16 which is substantially equal to $K*I_X$. This can be accomplished by having similar configurations for both the first and second variable current sources 14 and 16 or having a routine that adjusts the configuration of the second.

Figure 2:
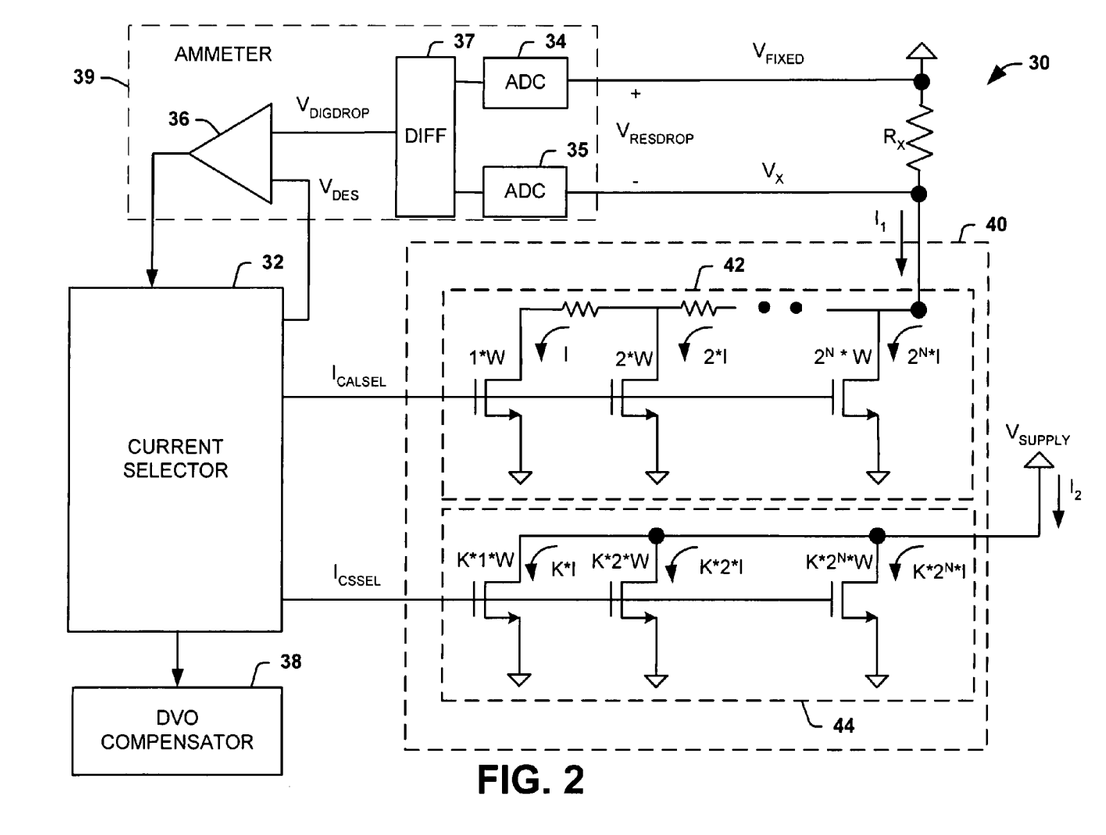
FIG. 2 illustrates an embodiment of a system for generating a current employing a first and second set of binary weighted FETs.

FIG. 2 illustrates a system 30 for generating a current employing a first and second set of binary weighted transistors. The system 30 includes a first set of binary weighted Field Effect Transistors (FETs) 42 configured to provide a first variable current source. The first set of binary weighted FETs 42 is operative to generate a first current $I_1$ based on a first selection signal $ICAL_{SEL}$. The system 30 includes a second set of binary weighted FETs 44 configured to provide a second variable current source. The second set of binary weighted FETs 44 is operative to generate a second current $I_2$ based on a second selection signal $ICS_{SEL}$. Each FET in the first set of binary weighted FETs 42 has an associated matching FET in the second set of binary weighted sets 44 that has a width that is a multiple K of its associated matching FET in the first set of binary weighted FETs 42, where K is an integer or fractional multiplier greater than one. The first set of binary weighted FETs 42 and the second set of binary weighted FETs form a current station 40. The first set of binary weighted FETs 42 and the second set of binary weighted FETs associated with the current station 40 can be formed at a substantially same location (e.g., on an IC), so as to be subjected to similar process variation for both the first and second set of binary weighted FETs 42 and 44. Additionally, a plurality of current stations can be distributed across an IC. It is to be appreciated that other semiconductor devices can be employed in place of the binary weighted FETs 42 and 44.

The first set of binary weighted FETs 42 include binary weighting associated with the widths of the FETs. For example, a first FET has a width of $1*W$, a second FET has a width of $2*W$, etc., until the final FET which has a width of $2^{N}*W$, where N is equal to the number of FETs in the first set of binary weighted FETs 42, where W is an arbitrary unit of width. This allows for incremental selection of a desired current utilizing, for example, a binary N-bit word. The first FET of the first set of binary weighted FETs sinks a current I, while the second FET sinks a current 2I, while the last FET sinks a current $2^{N}*I$. For example, a set of eight FETs can be controlled by an 8-bit binary word via the first selection signal $ICAL_{SEL}$, such that the word "00000001" would provide a current I, a word "00000010" word provide a current 2I, a word "00000011" would provide a current 3I, and a word "11111111" would provide a current 255I collectively equal to $I_1$.

The second set of binary weighted FETs 44 is configured to provide a second variable current source. The second set of binary weighted FETs 44 is operative to generate a second current based on a second selection signal $IC_{SEL}$. Each FET in the second set of binary weighted FETs 44 has a width that is a multiple K of an associated FET in the first set of binary weighted FETs. The drains of each FET in the second set of binary weighted FETs 44 are coupled to a supply voltage $V_{SUPPLY}$.

The second set of binary weighted FETs 44 include binary weighting associated with the widths of the FETs. For example, a first FET has a width of $K*1*W$, a second FET has a width of $K*2*W$, etc., until the final FET, which has a width of $K*2^{N}*W$. This allows for incremental selection of a desired second current utilizing a similar binary N-bit word as the first set of binary weighted FETs 42. For example, the first FET of the second set of binary weighted FETs 44 sinks a current $K*I$, the second FET sinks a current $K*2*I$, while the last FET sinks a current $K*2^{N}*I$, where N is the number of FETs in the second set. By providing corresponding matched FETs in the first and second sets of binary weighted FETs 42 and 44, a first current can be derived associated with the first set of binary weighted FETs 42, and the second selection signal $ICS_{SEL}$ can be set to a similar setting as the first selection signal $ICAL_{SEL}$ to provide a second current from the second set of binary weighted FETs 44 that is a multiple K of the first current.

The drains of the first set of binary weighted FETs 42 are coupled to a first end of a precision resistor $R_X$, while the second end of the precision resistor $R_X$ is coupled to a fixed reference voltage $V_{FIXED}$. The first current associated with the first set of binary weighted FETs 42 causes current to flow from $V_{FIXED}$ through the precision resistor $R_X$ providing a voltage drop $V_{RESDROP}$ across the precision resistor $R_X$. The voltage drop $V_{RESDROP}$ is equal to the voltage $V_{FIXED}$ at the second end of the precision resistor $R_X$ minus the voltage $V_X$ at the first end of the precision resistor $R_X$. The voltage $V_{FIXED}$ is provided to a first analog-to-digital converter 34 and the voltage $V_X$ is provided to a second ADC 35. The first and second ADCs 34 and 35 convert the voltages $V_{FIXED}$ and $V_X$ from the analog to the digital domain, and provide the digital values to a difference component 37. The difference component 37 determines the voltage drop $V_{DIGDROP}$ in digital form associated with the analog voltage drop $V_{RESDROP}$ across the precision resistor $R_X$.

The voltage drop $V_{DIGDROP}$ is then provided to a comparator 36, which compares the digital value of the voltage drop $V_{DIGDROP}$ with a desired voltage drop $V_{DES}$. The desired voltage drop $V_{DES}$ can be predetermined or selected programmatically. The ADCs 34 and 35, the difference component 37 and the comparator 36 form an ammeter 39. The results from the ammeter 37 are then provided to a current selector 32, which increments or decrements the current $I_1$ flowing through the first set of binary weighted FETs 42 via the first selection signal $ICAL_{SEL}$ based on the ammeter results. This is repeated until the desired voltage $V_x$ has been achieved, and thus the selected first current has been achieved.

Once the desired first current is achieved, the current selector 32 sets the second selection signal $ICS_{SEL}$ to a similar setting as the first selection signal $ICAL_{SEL}$, such that the same associated FETs in both the first and second set of binary weighted FETs 42 and 44 are turned "ON" to produce a second current $I_2$ through the second set of binary weighted FETs 44 that is a multiple K of the first current $I_1$. However, since the drain voltage ($V_X$) of first set of binary weighted FETs 42 is different from the drain voltage ($V_{SUPPLY}$) of the second set of binary weighted FETs 44, the second current $I_2$ will not be an exact multiple of the first current $I_1$. The current selector 32 employs a drain voltage offset (DVO) compensator 38 to determine the actual current provided by the second set of binary weighted FETs 44. The DVO compensator 38 can be an algorithm, or a table that employs a current correction factor ($V_{DSMOD}$) to determine the actual current $I_2$ associated with the second set of binary weighted FETs 44.

A set of current correction factors for different supply voltages ($V_{SUPPLY}$) can be determined by evaluating the $I_D$–$V_{DS}$ characteristics (e.g., utilizing a SPICE evaluation) associated with the FETs employed in both the first set of binary weighted FETs 42, and the second set of binary weighted FETs 44. Table I below illustrates an exemplary set of $V_{DSMOD}$ current correction factors associated with different supply voltages ($V_{SUPPLY}$). The $V_{DSMOD}$ is a channel length modulation correction factor since the drain voltage of the first set of binary weighted FETs 42 is different than the drain voltage of the second set of binary weighted FETs 44. Table I illustrates a ratio of the drain current of a 0.18 um width and 0.1 um length FET, and an associated supply voltage ranging from 0.6875 volts to 1.203125V to the same size FET with a drain voltage of 0.95V.

TABLE I

| $V_{SUPPLY}$ | $V_{DSMOD}$ |
| --- | --- |
| 0.6875 V | 0.9512924 |
| 0.734375 V | 0.9633296 |
| 0.78125 V | 0.9735261 |
| 0.828125 V | 0.9898123 |
| 0.875 V | 0.9898123 |
| 0.921875 V | 0.9964204 |
| 0.96875 V | 1.002259 |
| 1.015625 V | 1.007468 |
| 1.0625 V | 1.012159 |
| 1.109375 V | 1.016420 |
| 1.203125 V | 1.023925 |

It is to be appreciated that the $V_{DSMOD}$ current correction factor will vary for different channel lengths associated with the first set of binary weighted FETs 42 and the second set of binary weighted FETs 44. The second current associated with the second set of binary weighted FETs 44 can be determined by the following equation:

$$ICS_{ACTUAL} = V_{DSMOD} * ICS_{SET} \qquad \text{EQ. 1}$$

where $ICS_{ACTUAL}$ is the actual current supplied by the second set of binary weighted FETs 44, $ICS_{SET}$ is the selected source current, and $V_{DSMOD}$ is the current correction factor, which is a function of the difference between the drain voltage ($V_{SUPPLY}$) of the second set of binary weighted FETs 44 and drain voltage ($V_X$) of the first set of binary weighted FETs 42.

Figure 3:
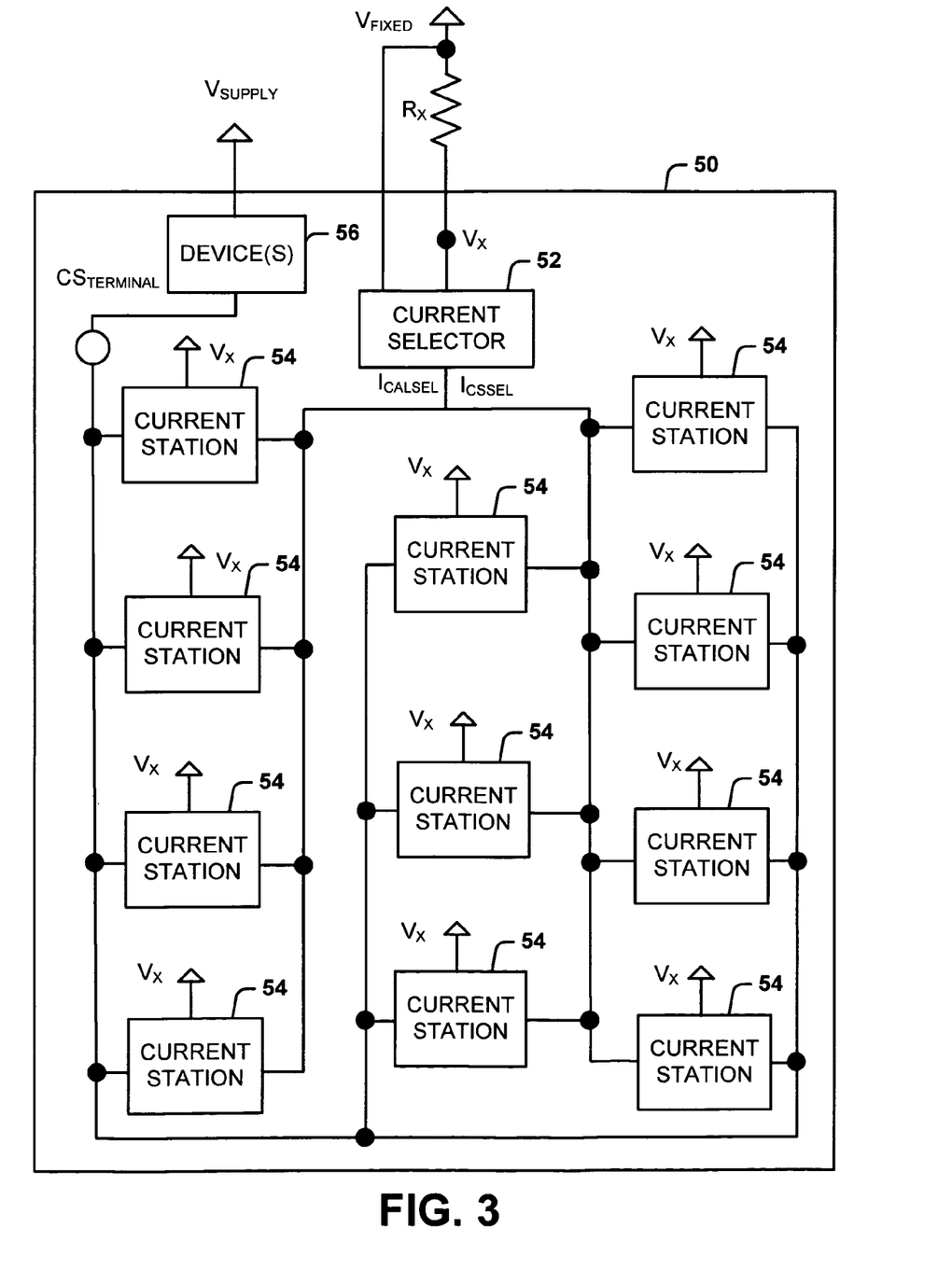
FIG. 3 illustrates an embodiment of an integrated circuit.

FIG. 3 illustrates schematic block diagram of an integrated circuit (IC) 50. The IC 50 or die includes a plurality of current stations 54 distributed at different locations over the IC 50. Each current station 54 includes a first set of binary weighted FETs that generate a first current or calibration current and a second set of binary weighted FETs that generate a second current or current source current. The current stations 54 are distributed across the IC 50 or die, so that the current source FETs pull current in a more uniform fashion across the IC 50 or die. The first set of binary weighted FETs of each current station 54 are coupled to a current selector 52 via a first select line $ICAL_{SEL}$, and the second set of binary weighted FETs of each current station 54 are coupled to the current selector 52 via a second select line $ICS_{SEL}$. It is to be appreciated that each of the first sets of binary weighted FETs and the second sets of binary weighted FETs could have assigned selection control lines for incrementing each of the sets individually, or single selection control lines for adjusting the first set of binary weighted FETs and/or the second sets of binary weighted FETs together.

A fixed reference voltage $V_{FIXED}$ is coupled to the current selector 52 and to a first end of a precision resistor $R_X$ residing off of the IC 50. A second end of the precision resistor $R_X$ is coupled to the current selector 52 such that the current selector 52 can measure the fixed reference voltage $V_{FIXED}$ and the voltage $V_X$ at the second end of the precision resistor $R_X$. The voltage $V_X$ is also coupled to the drains of the first set of binary weighted transistors of each current station 54. The current selector 52 adjusts the current through the first set of binary weighted FETs for each current station 54 based on the measured voltage drop across the precision resistor $R_X$, until a desired first current is achieved. The drains of the second set of binary weighted FETs for each of the current stations 54 are coupled to a current source terminal $CS_{TERMINAL}$. In this example, the current source terminal $CS_{TERMINAL}$ is coupled to a supply voltage $V_{SUPPLY}$ through one or more device(s) 56 on the IC. However, the current source terminal $CS_{TERMINAL}$ can be directly coupled to the supply voltage $V_{SUPPLY}$ depending on the particular implementation being employed.

Figure 4:
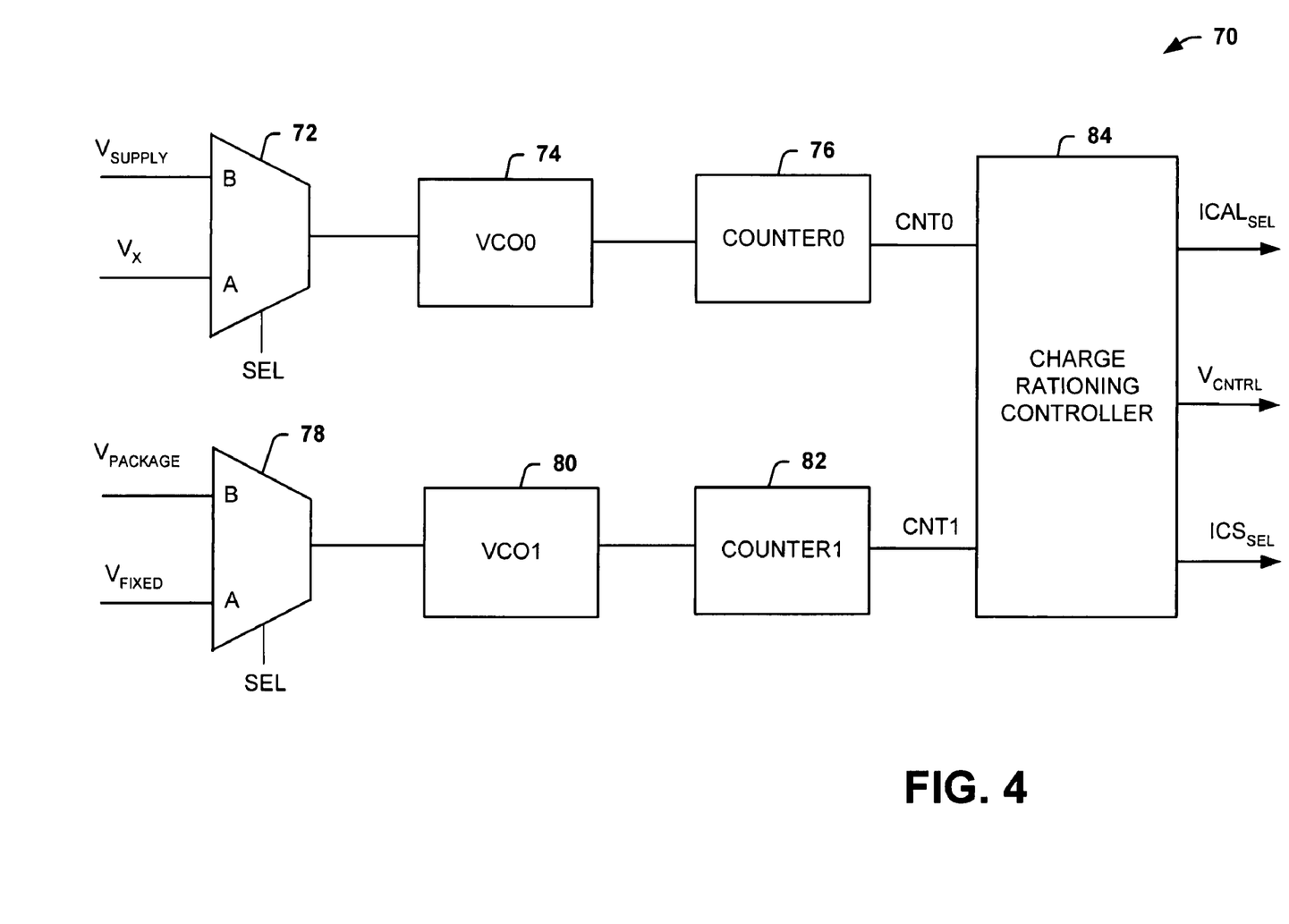
FIG. 4 illustrates an embodiment of a charge rationing system.

FIG. 4 illustrates a block diagram of a charge rationing system 70 that employs a variable current source. The charge rationing system 70 monitors current drawn through an IC package or die and dynamically adjusts the power of the IC based on the current draw. A current source or system for generating current (not shown) as illustrated in FIGS. 1–3 can be employed to calibrate the charge rationing system 70. For example, the current through the IC can be determined by measuring the voltage $V_{SUPPLY}$ at the input of the IC or die and determining the voltage $V_{PACKAGE}$ at one or more locations across the IC to determine a voltage drop across the package. The voltage drop across the package can be divided by the package resistance to determine the current drawn through the IC. The input voltage $V_{SUPPLY}$ can be dynamically adjusted via a voltage supply control $V_{CNTRL}$ based on the current measurements made during operation of the IC to mitigate power consumption and to facilitate operational efficiency.

The system for generating a current (not shown) provides a known fixed current that can be employed to calibrate the charge rationing system 70. A charge rationing controller 84 can be employed to set the current of both the first variable current source and the second variable current source utilizing a similar technique as described with respect to the current selector 32 of FIG. 2. During a first stage, "A" inputs of a first multiplexer 72 and a second multiplexer 78 are provided to outputs of the respective multiplexers based on a state of multiplexer select lines (SEL). A voltage $V_X$ at a node that couples a first end of a precision resistor to a first variable current source is provided at the output of the first multiplexer 72, and a fixed reference voltage $V_{FIXED}$ that is coupled to a second end of the precision resistor is provided at the output of the second multiplexer 78 during calibration.

The output of the first multiplexer 72 is coupled to a first voltage controlled oscillator (VCO0) 74. The first voltage controlled oscillator 74 provides a first oscillating signal having a frequency associated with the voltage level of the voltage $V_X$. A first counter (COUNTER0) 76 increments over a predetermined period of time to a count that corresponds to the frequency of the first oscillating signal. In this manner, the first voltage controlled oscillator 74 and the first counter 76 function as an A/D converter to provide a digital count value that corresponds to the voltage $V_X$. The count value (CNT0) of the first counter is then provided to the charge rationing controller 84.

The output of the second multiplexer 78 is coupled to a second voltage controlled oscillator (VCO1) 80. The second voltage controlled oscillator 80 provides a second oscillating signal having a frequency associated with the voltage level of the voltage $V_{FIXED}$. A second counter (COUNTER1) 82 increments over the same predetermined period of time as the first counter 76 to a count that corresponds to the frequency of the second oscillating signal. In this manner, the second voltage controlled oscillator 80 and the second counter 82 function as an A/D converter to provide a digital count value that corresponds to the voltage $V_{FIXED}$. The count value (CNT1) of the second counter 82 is then provided to the charge rationing controller 84.

The charge rationing controller 84 determines the voltage difference between the $V_X$ count value and the $V_{FIXED}$ count value. A current associated with the first current source can then be determined by dividing the voltage difference by the value of the precision resistor. The charge rationing controller 84 determines if a desired first current has been achieved. The charge rationing controller 84 can adjust the first variable current source employing a selection signal $ICAL_{SEL}$ and repeat the measurement process, until the desired first variable current from the first variable current source is achieved. Once the desired first variable current from the first variable current source is achieved, the charge rationing controller 84 sets the second variable current source via a select line $IC_{SEL}$ to provide a second current that is a multiple of the first current. The charge rationing controller 84 then employs a voltage compensator (not shown) to compensate for the differences in the voltages supplying power to the first and second variable current sources to determine the actual second current. The actual second current can be employed to calibrate the charge rationing system 84.

During a second stage, "B" inputs of a first multiplexer 72 and a second multiplexer 78 are provided to outputs of the respective multiplexers based on a state of multiplexer select lines (SEL). The voltage from the input voltage $V_{SUPPLY}$ is provided to the output of the first multiplexer 72, while the voltage $V_{PACKAGE}$ is provided at the output of the second multiplexer 78. A normal voltage drop across the IC can be measured with the second current in an "OFF" state. The first voltage controlled oscillator 74 provides a first oscillating signal having a frequency associated with the voltage level of the voltage $V_{SUPPLY}$. The first counter 76 increments over a predetermined period of time to a count that corresponds to the frequency of the first oscillating signal. Similarly, the second voltage controlled oscillator 80 provides a second oscillating signal having a frequency associated with the voltage level of the voltage $V_{PACKAGE}$. The second counter 82 increments over the predetermined period of time to a count that corresponds to the frequency of the second oscillating signal. A difference value D1 is determined associated with the voltage drop across the package.

The second current source is turned to the "ON" state. Again, the first voltage controlled oscillator 74 provides a first oscillating signal having a frequency associated with the voltage level of the voltage $V_{SUPPLY}$. The first counter 76 increments over a predetermined period of time to a count that corresponds to the frequency of the first oscillating signal. Similarly, the second voltage controlled oscillator 80 provides a second oscillating signal having a frequency associated with the voltage level of the voltage $V_{PACKAGE}$. The second counter 82 increments over the predetermined period of time to a count that corresponds to the frequency of the second oscillating signal. A difference value D2 is determined associated with the voltage drop across the package with the second current source "ON". The package resistance for the IC can be determined by evaluating the following expression:

$$R_{PKG}=(D2-D1)/ICS \qquad \text{EQ. 2}$$

This value can be stored for use during normal operation. During normal operation the IC power can be determined by evaluating the expression:

$$P=V_{DIE}*V_{PKGDROP}/R_{PKG} \qquad \text{EQ. 3}$$

where $V_{PKGDROP}=V_{PACKAGE}-V_{DIE}$.

Figure 5:
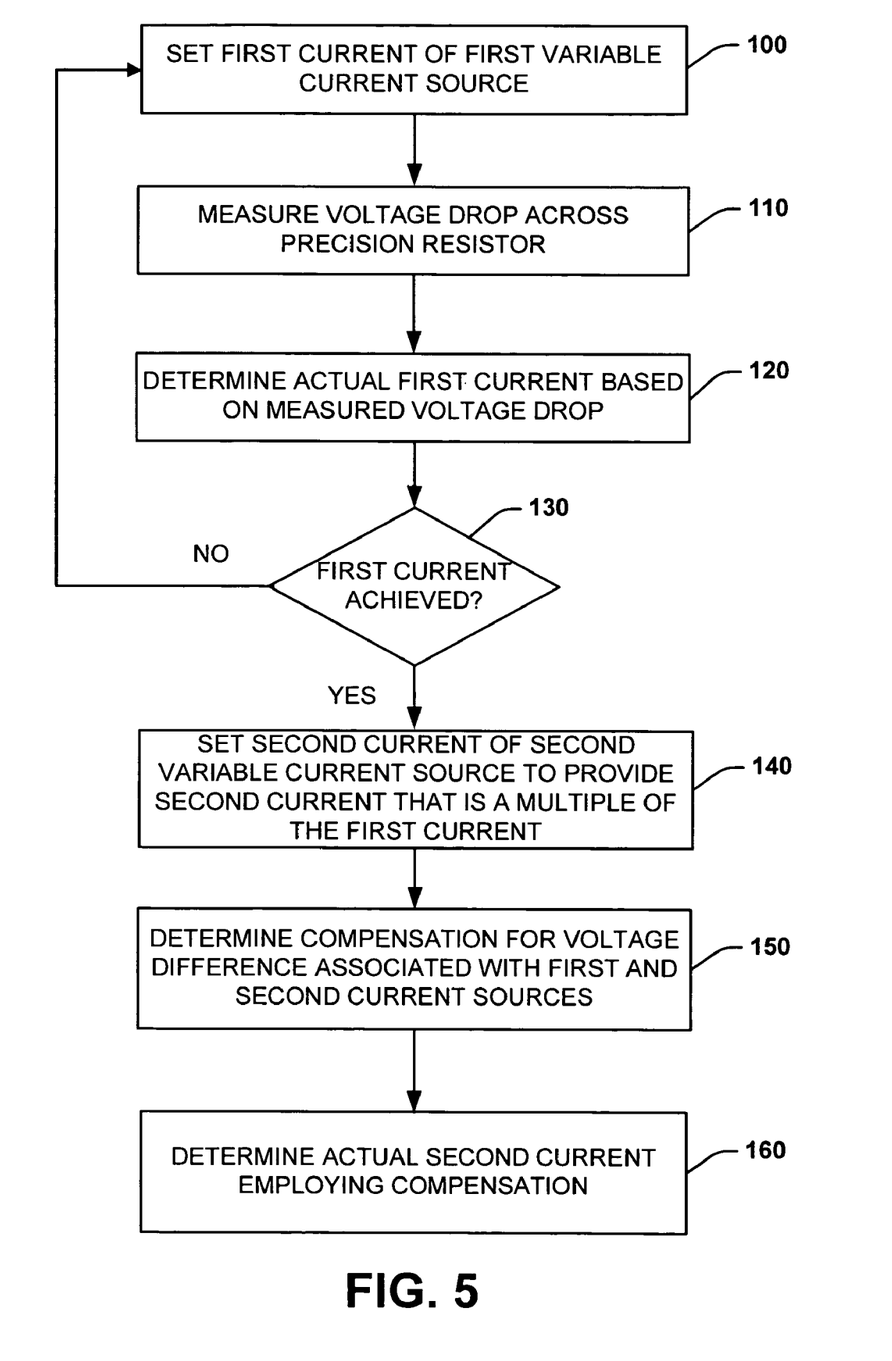
FIG. 5 is a flow diagram illustrating an embodiment of a methodology for generating a current.

In view of the foregoing structural and functional features described above, a methodology will be better appreciated with reference to FIG. 5. While, for purposes of simplicity of explanation, the methodologies of FIG. 5 are shown and described as being implemented serially, it is to be understood and appreciated that the present invention is not limited to the illustrated order, as some aspects could, in accordance with the present invention, occur in different orders and/or concurrently with other aspects from that shown and described. Moreover, not all illustrated features may be required to implement a methodology. It is to be further understood that the following methodology can be implemented in hardware, software (e.g., computer executable instructions), or any combination thereof.

FIG. 5 illustrates a methodology for generating a current. The methodology begins at 100 where a first variable current source is set to generate a first current. The first variable current source is coupled to a fixed reference voltage through a precision resistor. The first variable current source can be one or more sets of binary weighted FETs that provide incremental current values based on the value of a binary N-bit selection signal, where N is the number of FETs in a set. At 110, the voltage drop across the precision resistor is measured to determine a voltage associated with the first current. At 120, the actual first current is determined based on the measured voltage drop. For example, the voltage drop can be measured employing an ADC to determine a digital value that corresponds to the voltage drop. The digital value of the voltage drop and the value of the precision resistor can be employed to determine an actual current sourced by the first variable current source. The methodology then proceeds to 130.

At 130, it is determined whether or not the desired first current associated with the first variable current source has been achieved. If the first current associated with the first variable current source has not been achieved (NO), the methodology returns to 100 to adjust the setting of the first current source until the desired first current has been achieved. If the first current associated with the first variable current source has been achieved (YES), the methodology proceeds to 140.

At 140, a second variable current source is set to generate a second current that is a multiple of the first current. The second variable current source can be one or more sets of binary weighted FETs that provide incremental current values based on the value of a binary N-bit selection signal, where N is the number of FETs in a set. Furthermore, the one or more binary weighted FETs associated with the second variable current source can have matching FETs associated with FETs in the first current source that have weightings that are a multiple K of the associated FETs in the first variable current source. For example, the FETs in the second variable current sources can have widths that are K times the widths of the associated first FETs, such that a second current is provided that is K times the first current for a similar selection of FETs. The second variable current source is powered employing a supply voltage (e.g., of an integrated circuit). The methodology then proceeds to 150.

At 150, compensation for voltage differences associated with voltages for powering the first and second current variable current sources is determined. For example, if the first and second variable current sources are binary weighted FETs, then the voltages difference correspond to the different drain voltages associated with the first and second set of binary weighted FETs. The compensation can be a set of current correction factors matched with different values of supply voltages. At 160, the actual second current is determined by applying one or more compensation factors to the selected second current.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for generating a current, comprising:
   a first current source having a first configuration that is selectively adjusted to achieve a first current, the first current source comprising a first set of binary weighted Field Effect Transistors (FETs) coupled to provide the first current; and
   a second current source having a second configuration that is selected to generate a second current that is a multiple of the first current in response to a selection of the first configuration, the second current source comprising a second set of binary weighted FETs coupled to provide the second current.

2. The system of claim 1, further comprising a precision resistor coupled between the first current source and a fixed reference voltage.

3. The system of claim 2, further comprising a current selector that determines the first current based on the voltage drop across the precision resistor and selectively adjusts a first current selection signal to a desired first current.

4. The system of claim 3, the current selector provides a second current selection signal to select the second current upon achieving the desired first current.

5. The system of claim 1, wherein each FET from the first set of binary weighted FETs is associated with a matching FET having a same relative binary weight from the second set of binary weighted FETs, and wherein each FET of the second set of binary weighted FETs has a width that is K times the width of the matching FET from the first set of FETs, where K is an integer greater than one.

6. The system of claim 5, the first set of binary weighted FETs and the second set of binary weighted FETs define a current station, and further comprising a plurality of additional first set of binary weighted FETs and additional second set of binary weighted FETs defining a plurality of current stations.

7. The system of claim 6, the plurality of current stations being distributed at different locations across an integrated circuit, such that the second current is drawn more uniformly across the integrated circuit.

8. The system of claim 5, wherein the first set of binary weighted FETs and the associated matching FETs from the second set of binary weighted FETs are respectively activated by a first binary selection signal and a second binary selection signal, the first binary selection signal and the second binary selection signal each being a substantially similar N-bit word upon selection of the first configuration.

9. The system of claim 1, the first set of binary weighted FETs having a common drain coupled to a first voltage and the second set of binary weighted FETs having a drain coupled to a second voltage, and further comprising a drain voltage offset compensator that compensates for the difference in drain voltage between the first and second sets of binary weighted FETs.

10. An integrated circuit comprising the system of claim 1.

11. The integrated circuit of claim 10, the first current source is associated with a reference voltage and the second current source is associated with a supply voltage of the integrated circuit.

12. The system of claim 1, further comprising a charge rationing system that employs the second current to calibrate the charge rationing system by measuring the difference with the second current source in an "OFF" state and the second current source in an "ON" state.

13. An integrated circuit comprising:
    a first set of semiconductor devices configured to provide a variable current source that generates a first current based on a first binary selection signal;
    a second set of semiconductor devices configured to provide a variable current source that generates a second current based on a second binary selection signal, each of the semiconductor devices of the first set of semiconductor devices having an associated matching semiconductor device from the second set of semiconductor devices that has a width that is a multiple of the width of the associated matching semiconductor device from the first set of semiconductor devices; and
    a control device that determines the value of the first current and sets the second binary selection signal to provide the second current that is a multiple of the first current.

14. The integrated circuit of claim 13, the first set of semiconductor devices are coupled to a fixed reference voltage through a precision resistor and the second set of semiconductor devices are coupled to a supply voltage of the integrated circuit.

15. The integrated circuit of claim 13, the control device determines the value of the first current by measuring the voltage across the precision resistor and determines the current flowing through the precision resistor based on the measured voltage and resistance of the precision resistor.

16. The integrated circuit of claim 13, the first set of semiconductor devices comprising a first set of binary weighted Field Effect Transistors (FETs) coupled to provide the first current and the second set of semiconductor devices comprising a second set of binary weighted FETs coupled to provide the second current.

17. The integrated circuit of claim 16, further comprising a drain voltage offset compensator having at least one current correction factor to compensate for different drain voltages associated with the first set of binary weighted FETs and the second set of binary weighted FETs, the controller employs the at least one current correction factor to determine an actual second current associated with the second variable current source.

18. The integrated circuit of claim 17, the drain voltage offset compensator comprising a drain voltage compensation table.

19. The integrated circuit of claim 18, further comprising a plurality of current stations, each of the current stations having a first set of binary weighted FETs and a second set of binary weighted FETs, the plurality of current stations being distributed at different locations across the integrated circuit.

20. The integrated circuit of claim 13, wherein the first binary selection signal and the second binary selection signal are each binary N-bit words, and wherein the control device sets the value of each of the first binary selection signal and the second binary selection signal to be substantially similar upon determining the value of the first current.

21. A system for providing a variable current on a Very Large Scale Integrated (VLSI) circuit comprising:
means for generating a first current;
means for selectively adjusting the first current to achieve a desired first current;
means for selecting a desired second current based on the achieved desired first current;
means for generating a second current that is a multiple of the first current; and
means for compensating for differences in voltages associated with powering the means for generating a first current and the means for generating a second current.

22. The system of claim 21, the means for selectively adjusting the first current to achieve a desired first current comprising means for measuring a voltage across a precision resistor coupled to a fixed reference voltage and the means for generating a first current, and means for evaluating the first current based on the measured voltage and resistance of the precision resistor.

23. A current generation method for an integrated circuit, comprising:
generating a first current through a precision resistor;
determining the value of the first current by measuring the voltage across the precision resistor and evaluating the value of the first current based on the measured voltage and resistance of the precision resistor;
selectively adjusting the first current and determining the value of the first current until a desired first current is achieved; and
generating a second current that has a value that is a multiple of the achieved first current.

24. The method of claim 23, the generating a first current comprising selecting at least one Field Effect Transistor (FET) of a first set of binary weighted FETs, and the generating a second current comprising selecting at least one matching FET from a second set of binary weighted FETs, the at least one FET of the first set of binary weighted FETs and the at least one matching FET from the second set of binary weighted FETs having a substantially similar binary weighting.

25. The method of claim 24, further comprising determining an actual second current by compensating for a difference in drain voltage associated with the first set of binary weighted FETs and the second set of binary weighted FETs.

26. The method of claim 24, wherein the generating the first current comprises activating a first N-bit binary selection signal to select the at least one FET of the first set of binary weighted FETs and the generating the second current comprises activating a second N-bit binary selection signal to select the at least one matching FET of the second set of binary weighted FETs, the first N-bit binary selection signal and the second N-bit binary selection signal being substantially similar.

27. A current source comprising:
a plurality of current stations distributed over different locations on an integrated circuit, each of the plurality of current stations having a first set of semiconductor devices and a second set of semiconductor devices, each of the semiconductor devices from the first set of semiconductor devices having a matching semiconductor device from the second set of semiconductor devices that has a width that is a multiple K of the width of the corresponding matching semiconductor device of the first set of semiconductor devices;
a first select signal associated with selecting a first current to be sourced by the first set of semiconductor devices;
a second select signal associated with selecting a second current to be sourced by the second set of semiconductor devices; and
a current selector that controls the state of the first select signal and the second select signal, and selects the first current sourced by the first set of semiconductor devices and the second current source by the second set of semiconductor devices.

28. The current source of claim 27, the first set of semiconductor devices comprising a first set of binary weighted Field Effect Transistors (FETs) coupled to provide the first current and the second set of semiconductor devices comprising a second set of binary weighted FETs coupled to provide the second current.

29. The current source of claim 28, further comprising a precision resistor coupled between a fixed reference voltage and drains of the first set of binary weighted FETs of each current station, and coupling a supply voltage to drains of the second set of binary weighted FETs of each current station.

30. The current source of claim 28, wherein the first select signal is a first N-bit binary signal that activates at least one FET from the first set of binary weighted FETS, and the second select signal is a second N-bit binary signal that activates at least one associated matching FET from the second set of binary weighted FETs, the first N-bit binary signal and the second N-bit binary signal having substantially similar values.

* * * * *

UNITED STATES PATENT AND TRADEMARK OFFICE
CERTIFICATE OF CORRECTION

PATENT NO. : 7,157,895 B2 Page 1 of 1
APPLICATION NO. : 10/700919
DATED : January 2, 2007
INVENTOR(S) : Samuel D. Naffziger et al.

It is certified that error appears in the above-identified patent and that said Letters Patent is hereby corrected as shown below:

In column 12, line 55, in Claim 30, delete "FETS" and insert -- FETs --, therefor.

Signed and Sealed this

Eighteenth Day of November, 2008

JON W. DUDAS
*Director of the United States Patent and Trademark Office*